(12) United States Patent
Hu et al.

(10) Patent No.: US 10,038,417 B2
(45) Date of Patent: Jul. 31, 2018

(54) CURRENT-BOOTSTRAP COMPARATOR AND OPERATIONAL AMPLIFIER THEREOF

(71) Applicant: NOVATEK Microelectronics Corp., Hsin-Chu (TW)

(72) Inventors: Min-Hung Hu, Hsinchu (TW); Ping-Lin Liu, Hsinchu (TW); Pin-Han Su, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/620,785

(22) Filed: Jun. 12, 2017

(65) Prior Publication Data

US 2017/0373653 A1    Dec. 28, 2017

Related U.S. Application Data

(60) Provisional application No. 62/353,052, filed on Jun. 22, 2016.

(51) Int. Cl.
*H03F 1/34* (2006.01)
*H03F 3/45* (2006.01)
*H03F 3/30* (2006.01)
*H03F 1/30* (2006.01)

(52) U.S. Cl.
CPC ......... *H03F 3/45215* (2013.01); *H03F 1/342* (2013.01); *H03F 3/301* (2013.01); *H03F 1/307* (2013.01); *H03F 1/34* (2013.01); *H03F 3/3022* (2013.01); *H03F 3/45* (2013.01); *H03F 3/45071* (2013.01); *H03F 3/45183* (2013.01); *H03F 2203/45026* (2013.01); *H03F 2203/45054* (2013.01); *H03F 2203/45074* (2013.01)

(58) Field of Classification Search
CPC .... H03F 3/45; H03F 3/45179; H03F 3/45183; H03F 3/45188; H03F 3/45192; H03F 2200/177; H03F 1/307; H03F 3/30; H03F 3/3001; H03F 3/3022; H03F 2203/30009; H03F 1/34; H03F 3/45071
USPC .......................................... 330/253, 255, 260
See application file for complete search history.

(56) References Cited

U.S. PATENT DOCUMENTS

| 2008/0290945 A1* | 11/2008 | Ivanov ................... H03F 3/3022 330/264 |
| 2015/0084694 A1* | 3/2015 | Lee ......................... H03F 3/301 330/255 |
| 2016/0233833 A1* | 8/2016 | Mora-Puchalt ....... H03F 1/0205 |

* cited by examiner

*Primary Examiner* — Khanh V Nguyen
(74) *Attorney, Agent, or Firm* — Winston Hsu

(57) ABSTRACT

A current-bootstrap comparator includes a receiving unit, a first current generation unit and a second current generation unit. The receiving unit receives a load voltage signal, a low threshold voltage and a high threshold voltage. The first current generation unit generates a first current. The second current generation unit generates a second current having a magnitude substantially same as a magnitude of the first current and a direction reverse to the first current. The first current and the second current are supplied to a next-stage circuit as a source current and a corresponding sink current, respectively, when the level of the load voltage signal is higher than the high threshold voltage or lower than the low threshold voltage. The magnitudes of the first current and the second current substantially equal zero when the level of the load voltage signal is between the high threshold voltage and the low threshold voltage.

25 Claims, 12 Drawing Sheets

CURRENT-BOOTSTRAP COMPARATOR AND OPERATIONAL AMPLIFIER THEREOF

CROSS REFERENCE TO RELATED APPLICATIONS

This application claims the benefit of U.S. Provisional Application No. 62/353,052, filed on Jun. 22, 2016, the contents of which are incorporated herein by reference.

BACKGROUND OF THE INVENTION

1. Field of the Invention

The present invention relates to a current-bootstrap comparator and an operational amplifier thereof, and more particularly, to a current-bootstrap comparator implemented in an operational amplifier.

2. Description of the Prior Art

An operational amplifier (op-amp), which is a common circuit structure used for supplying a specific voltage and driving current to a capacitive load, is usually implemented with a feedback loop to lock the voltage level of its output voltage signal. However, in a practical circuit, the connection wire between the op-amp and the capacitive load has parasitic impedance. The parasitic impedance may limit a driving current when the op-amp supplies the driving current to the capacitive load, such that the settling speed of the voltage signal actually supplied to the capacitive load cannot follow the slew rate of the op-amp. When the capacitive load is far from the output node of the op-amp, the parasitic impedance may severely degrade the driving capability of the op-amp.

For example, in a display panel, an op-amp is used for generating a common voltage VCOM, which is cooperated with a pixel electrode voltage to determine the gray scale to be displayed in a pixel unit. The common voltage VCOM should be stable throughout the display panel. However, the display panel may include parasitic impedance in the connection wire between the output node of the op-amp and a common voltage node on the display panel, and the parasitic impedance is relatively large when the common voltage node is far from the output node of the op-amp. Besides, when the pixel electrode voltage is toggled, the variations on the pixel electrode voltage may easily be coupled to the common voltage node and thus generate a large variation on the common voltage VCOM. Due to the parasitic impedance and the signal coupling via the capacitive load, the common voltage VCOM may be settled to the target voltage slowly.

Please refer to FIG. 1A, which is a schematic diagram of a circuit system 10 including an op-amp 100 which drives a capacitive load $C_L$, to achieve a target voltage and stably remain at the target voltage. As shown in FIG. 1A, the op-amp 100 receives a reference voltage $V_{REF}$ to generate an output voltage signal $V_{OUT}$, and actually not the ideal output voltage signal $V_{OUT}$ but a load voltage signal $V_{LOAD}$ is provided to the capacitive load $C_L$ since a parasitic impedance $R_{PAR}$ exists between the output node of the op-amp 100 and the capacitive load $C_L$. In a case that the op-amp 100 is used for generating a common voltage VCOM, the capacitive load $C_L$ may be the capacitor (s), including parasitic capacitors, coupled to the common voltage node. FIG. 1B illustrates the waveforms of the output voltage signal $V_{OUT}$ and the load voltage signal $V_{LOAD}$. When the drive signal $V_{DRIVE}$ is toggled, the drive signal $V_{DRIVE}$ are coupled through the capacitive load $C_L$ to affect the load voltage signal $V_{LOAD}$ and the output voltage signal $V_{OUT}$. The output voltage signal $V_{OUT}$, which is in the output node of the op-amp 100, is settled to the reference voltage $V_{REF}$ rapidly via the operations of the op-amp 100. However, the load voltage signal $V_{LOAD}$, especially for the capacitive load $C_L$ far from the output node of the op-amp 100, is settled to the reference voltage $V_{REF}$ much slowly due to the parasitic impedance $R_{PAR}$.

In order to solve the problem, an RC feedback circuit is applied to an op-amp such that the op-amp generates the output voltage signal $V_{OUT}$ according to the voltage level of the load voltage signal $V_{LOAD}$. Please refer to FIG. 2A, which is a schematic diagram of a circuit system 20 including an op-amp 200 having a feedback circuit structure. As shown in FIG. 2A, the circuit structure of the op-amp 200 is similar to the circuit structure of the op-amp 100 except for the RC feedback circuit, which includes a coupling capacitor $C_{CP}$ and resistors R1 and R2. With this RC feedback circuit, the variation of the load voltage signal $V_{LOAD}$ is amplified and fed back to the op-amp 200; hence, the op-amp 200 generates an output voltage signal $V_{OUT}$ higher or lower than the reference voltage $V_{REF}$ so as to generate a larger driving current and thereby pulls the voltage level of the load voltage signal $V_{LOAD}$ to the reference voltage $V_{REF}$ more rapidly. The waveforms of the output voltage signal $V_{OUT}$, the load voltage signal $V_{LOAD}$ and the feedback signal $V_{FB}$ are shown in FIG. 2B.

However, the RC feedback circuit requires a large capacitance in the feedback loop such that the coupling capacitor $C_{CP}$ may not be disposed inside an integrated circuit. The external coupling capacitor $C_{CP}$ occupies a large area and requires a higher cost in the circuit. In addition, the stability of the op-amp may be affected by the RC feedback circuit. Thus, there is a need to provide another circuit structure allowing the op-amp to enhance its capability of stabilizing the load voltage signal without the usage of external circuit elements such as external capacitors.

SUMMARY OF THE INVENTION

It is therefore an objective of the present invention to provide a current-bootstrap comparator implemented in an operational amplifier (op-amp), where the current-bootstrap comparator is triggered by a load voltage signal, to provide a bootstrap current for the op-amp when the voltage level of the load voltage signal is above a high threshold voltage or below a low threshold voltage.

The present invention discloses a current-bootstrap comparator, which comprises a receiving unit, a first current generation unit and a second current generation unit. The receiving unit is used for receiving a load voltage signal, a low threshold voltage and a high threshold voltage. The first current generation unit is used for generating a first current. The second current generation unit is used for generating a second current, which has a magnitude substantially same as a magnitude of the first current and has a direction reverse to the first current. One of the first current and the second current is supplied to a next-stage circuit as a source current and the other is supplied to the next-stage circuit as a corresponding sink current, when the level of the load voltage signal is higher than the high threshold voltage or when the level of the load voltage signal is lower than the low threshold voltage. The magnitudes of the first current and the second current are substantially equal to zero when the level of the load voltage signal is between the high threshold voltage and the low threshold voltage.

The present invention further discloses an op-amp, which comprises a comparator, an operational transconductance amplifier (OTA) and an output stage circuit. The comparator is used for receiving a load voltage signal, a low threshold voltage and a high threshold voltage and generating a first current and a second current according to a voltage region which the level of the load voltage signal is in, wherein the first current and the second current are in reverse directions. The OTA, which comprises a first node for receiving a reference voltage, a second node for receiving an output voltage signal of the op-amp, a third node for receiving or outputting the first current, and a fourth node for receiving or outputting the second current, is configured to generate a source current and a sink current. The output stage circuit is used for outputting the output voltage signal and controlling the output voltage signal via the source current and the sink current of the OTA.

The present invention further discloses a current-bootstrap comparator, which comprises a receiving unit, a current supply unit and a current draw unit. The receiving unit is used for receiving a load voltage signal, a low threshold voltage and a high threshold voltage. The current supply unit is used for supplying a first current to a first output node of the current-bootstrap comparator when the level of the load voltage signal is higher than the high threshold voltage or lower than the low threshold voltage. The current draw unit is used for drawing a second current from a second output node of the current-bootstrap comparator when the level of the load voltage signal is higher than the high threshold voltage or lower than the low threshold voltage.

The present invention further discloses an op-amp, which comprises an OTA, an output stage circuit and a current-bootstrap comparator. The OTA, which comprises a first node for receiving a reference voltage, a second node for receiving an output voltage signal of the op-amp, a third node for receiving a first current, and a fourth node for outputting a second current, is configured to generate a source current and a sink current. The output stage circuit is used for outputting the output voltage signal and controlling the output voltage signal via the source current and the sink current of the OTA. The current-bootstrap comparator comprises a receiving unit, a current supply unit and a current draw unit. The receiving unit is used for receiving a load voltage signal, a low threshold voltage and a high threshold voltage. The current supply unit is used for supplying the first current to the OTA when the level of the load voltage signal is higher than the high threshold voltage or lower than the low threshold voltage. The current draw unit is used for drawing the second current from the OTA when the level of the load voltage signal is higher than the high threshold voltage or lower than the low threshold voltage.

These and other objectives of the present invention will no doubt become obvious to those of ordinary skill in the art after reading the following detailed description of the preferred embodiment that is illustrated in the various figures and drawings.

DETAILED DESCRIPTION

According to an embodiment of the present invention, a current-bootstrap comparator is applied to a two-stage operational amplifier (op-amp). The current-bootstrap comparator may operate and output a bootstrap current to the two-stage op-amp when the level of the load voltage signal is above a high threshold higher than a target voltage range or below a low threshold lower than the target voltage range, such that the load voltage signal can be settled to a target voltage more rapidly. This embodiment may have an effect that the settling speed of the load voltage signal at the nodes far from the output node of the op-amp is increased.

Figure 3:
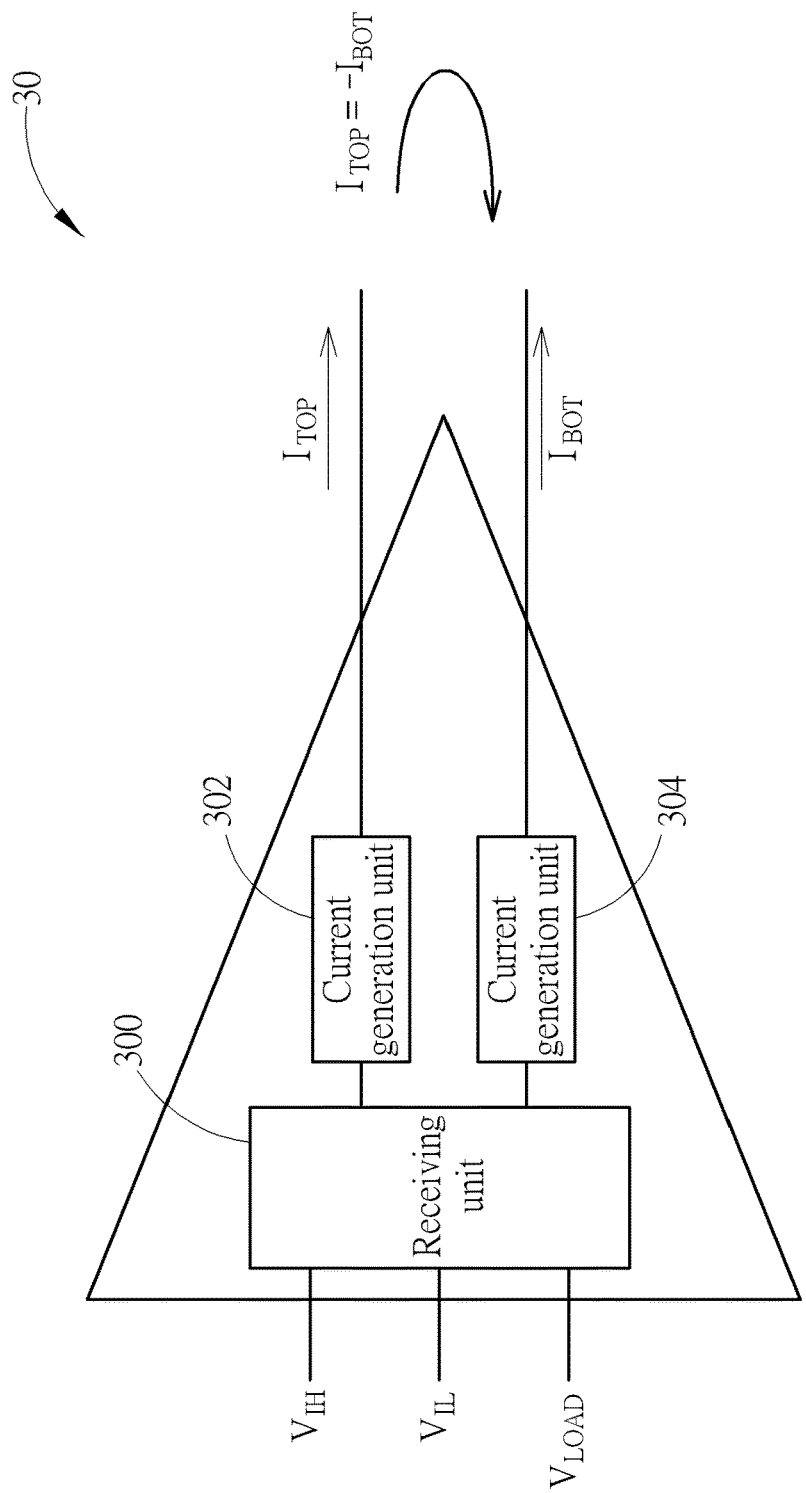
FIG. 3 is a schematic diagram of a current-bootstrap comparator according to an embodiment of the present invention.
Figure 4:
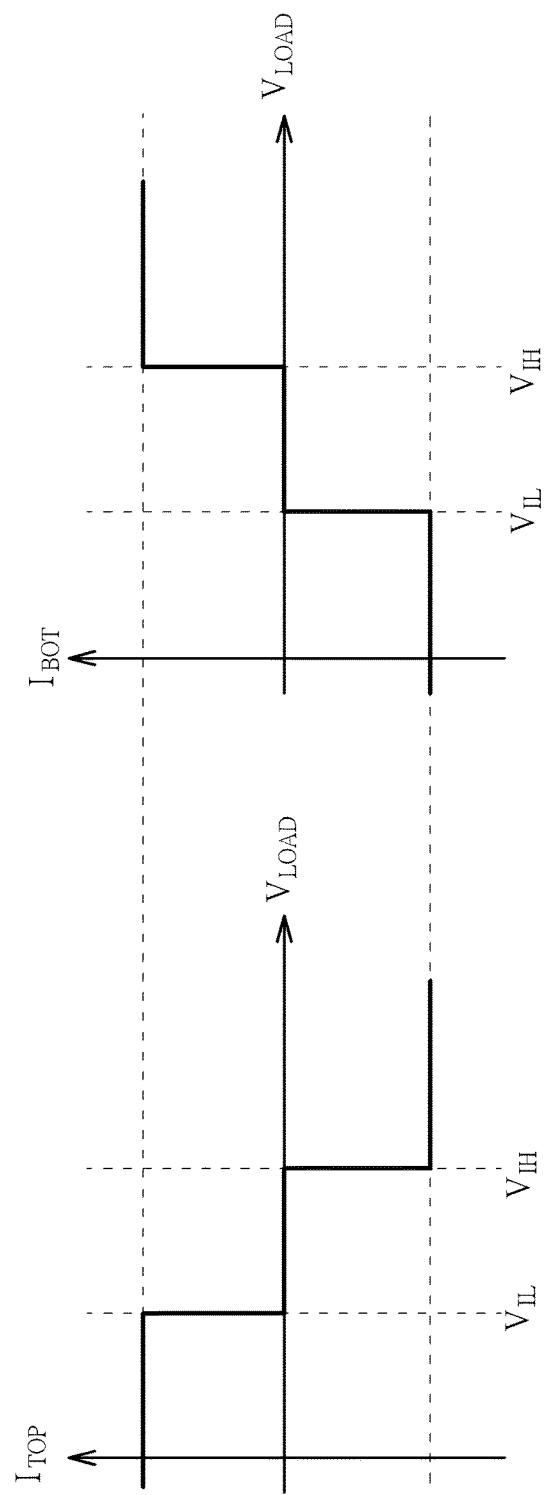
FIG. 4 illustrates the relations of the input/output signals of the current-bootstrap comparator.

Please refer to FIG. 3, which is a schematic diagram of a current-bootstrap comparator 30 according to an embodiment of the present invention. As shown in FIG. 3, the current-bootstrap comparator 30 includes a receiving unit 300 and current generation units 302 and 304. The receiving unit 300 is used for receiving a load voltage signal $V_{LOAD}$, a low threshold voltage $V_{IL}$ and a high threshold voltage $V_{IH}$. The levels of the low threshold voltage $V_{IL}$ and the high threshold voltage $V_{IH}$ may be predetermined and the high threshold voltage $V_{IH}$ is higher than the low threshold voltage $V_{IL}$. The current generation unit 302 is used for generating a top bootstrap current $I_{TOP}$, and the current generation unit 304 is used for generating a bottom bootstrap current $I_{BOT}$. The magnitude of the top bootstrap current $I_{TOP}$ is substantially the same as the magnitude of the bottom bootstrap current $I_{BOT}$, and the direction of the top bootstrap current $I_{TOP}$ is reverse to the direction of the bottom bootstrap current $I_{BOT}$. When the level of the load voltage signal $V_{LOAD}$ is higher than the high threshold voltage $V_{IH}$ or when the level of the load voltage signal $V_{LOAD}$ is lower than the low threshold voltage $V_{IL}$, one of the top bootstrap current $I_{m}p$ and the bottom bootstrap current $I_{BOT}$ is supplied to the next-stage circuit as a source current and the other is supplied to the next-stage circuit as a corresponding sink current. When the level of the load voltage signal $V_{LOAD}$ is between the high threshold voltage $V_{IH}$ and the low threshold voltage $V_{IL}$, the top bootstrap current $I_{TOP}$ and the bottom bootstrap current $I_{BOT}$ may be substantially equal to zero. More specifically, the current-bootstrap comparator 30 compares the load voltage signal $V_{LOAD}$ with the low threshold voltage $V_{IL}$ and the high threshold voltage $V_{IH}$, and generates the top bootstrap current $I_{TOP}$ and the bottom bootstrap current $I_{BOT}$ only when the level of the load voltage signal $V_{LOAD}$ rises above the high threshold voltage $V_{IH}$ or falls below the low threshold voltage $V_{IL}$. The relations of the input/output signals of the current-bootstrap comparator 30 are illustrated in FIG. 4.

Please note that the current-bootstrap comparator 30 may be applied to a two-stage op-amp to form a current bootstrap comparator (CBC)-based threshold triggered overdriven operational amplifier, to enhance the driving capability. A general two-stage op-amp may include an operational transconductance amplifier (OTA) and an output stage circuit. The OTA may receive voltages via a differential pair and thereby generate a source current and a sink current. The output stage circuit may output an output voltage signal according to the source current and the sink current. The current-bootstrap comparator 30 may be coupled to the OTA to supply the top bootstrap current and the bottom bootstrap current to the OTA.

Figure 5:
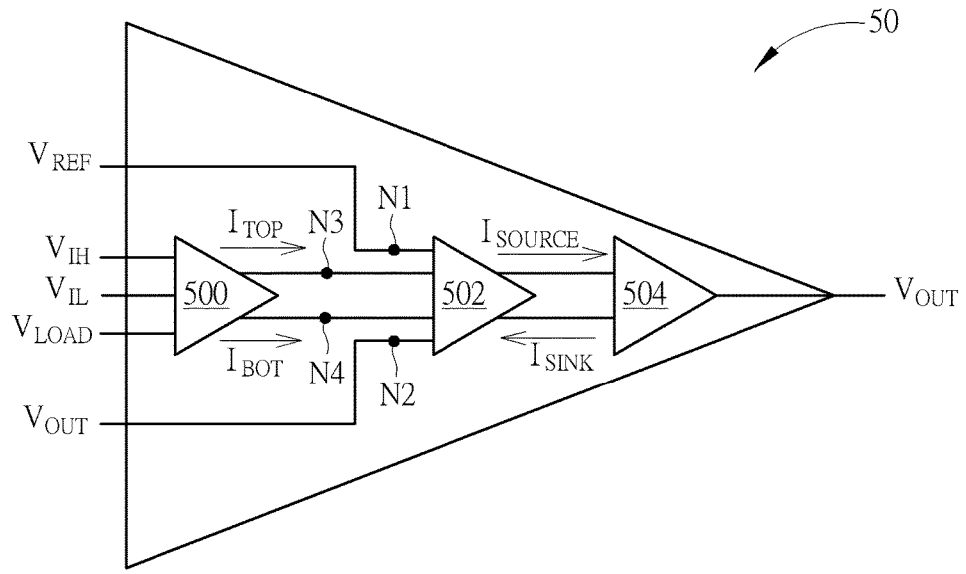
FIG. 5 is a schematic diagram of an op-amp according to an embodiment of the present invention.

For example, please refer to FIG. 5, which is a schematic diagram of an op-amp 50 according to an embodiment of the present invention. The op-amp 50 may be the current bootstrap comparator (CBC)-based threshold-triggered overdriven operational amplifier. As shown in FIG. 5, the op-amp 50 includes a comparator 500, an OTA 502 and an output stage circuit 504. The comparator 500, which may be a current-bootstrap comparator, e.g., the current-bootstrap comparator 30 shown in FIG. 3, may receive the load voltage signal $V_{LOAD}$, the low threshold voltage $V_{IL}$ and the high threshold voltage $V_{IH}$, and generate the top bootstrap current $I_{TOP}$ and the bottom bootstrap current $I_{BOT}$ according to a voltage range which the level of the load voltage signal $V_{LOAD}$ is in, wherein the top bootstrap current $I_{TOP}$ and the bottom bootstrap current $I_{BOT}$ are in reverse directions and have the same magnitude. In other words, the comparator 500 may compare the load voltage signal $V_{LOAD}$ with the high threshold voltage $V_{IH}$ and the low threshold voltage $V_{IL}$, and generate the top bootstrap current $I_{TOP}$ and the bottom bootstrap current $I_{BOT}$ according to the comparison result. The OTA 502 includes a first node N1, a second node N2, a third node N3 and a fourth node N4. The first node N1 and the second node N2 are input nodes, for receiving a reference voltage $V_{REF}$ and an output voltage signal $V_{OUT}$ of the op-amp 50, respectively. The third node N3 and the fourth node N4 are current nodes, for receiving or outputting the top bootstrap current $I_{TOP}$ and the bottom bootstrap current $I_{BOT}$, respectively. The reference voltage $V_{REF}$ may be a target voltage of the load voltage signal $V_{LOAD}$, and the value of the reference voltage $V_{REF}$ may be between the low threshold voltage $V_{IL}$ and the high threshold voltage $V_{IH}$, which is regarded as the target voltage range. The OTA 502 is further configured to generate a source current $I_{SOURCE}$ and a sink current $I_{SINK}$. The output stage circuit 504 is used for outputting the output voltage signal $V_{OUT}$ and controlling the output voltage signal $V_{OUT}$ via the source current $I_{SOURCE}$ and the sink current $I_{SINK}$ of the OTA 502. In an embodiment, the output stage circuit 504 of the op-amp 50 may include a high-side transistor and a low-side transistor.

Figure 6:
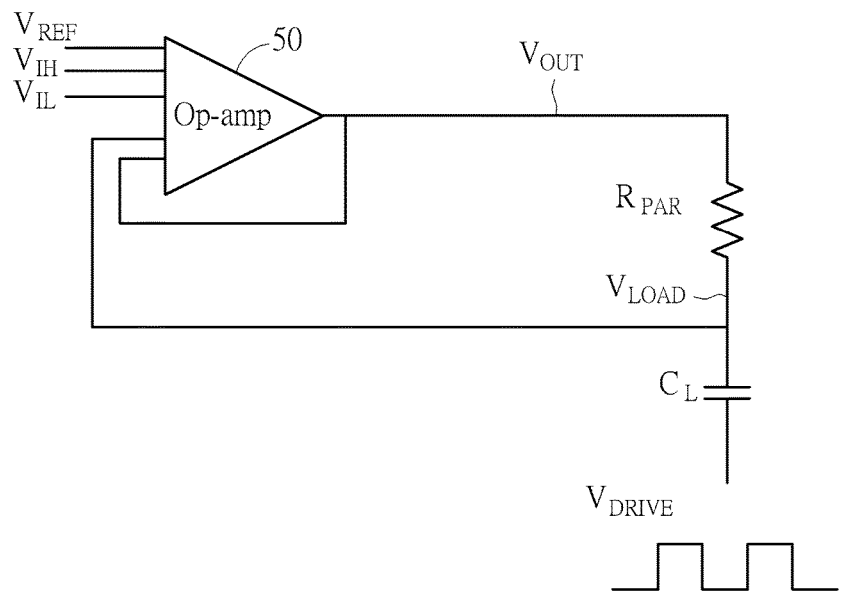
FIG. 6 is a schematic diagram of operations of the op-amp shown in FIG. 5.

Please refer to FIG. 6, which is a schematic diagram of operations of the op-amp 50. As shown in FIG. 6, the op-amp 50 receives a reference voltage $V_{REF}$ to generate an output voltage signal $V_{OUT}$. Due to the parasitic impedance $R_{PAR}$ of the connection wire between the output node of the op-amp 50 and the capacitive load $C_L$ (such as the capacitors coupled to a common voltage node of a display panel), the driving current provided to the capacitive load $C_L$ is limited by the parasitic impedance $R_{PAR}$ and the actual voltage provided to the capacitive load $C_L$ is not ideally the output voltage signal $V_{OUT}$ but the load voltage signal $V_{LOAD}$.

In this embodiment, the op-amp 50 is applied to stabilize the load voltage signal $V_{LOAD}$. In detail, the comparator 500 of the op-amp 50 receives the load voltage signal $V_{LOAD}$ and compares the load voltage signal $V_{LOAD}$ with the high threshold voltage $V_{IH}$ and the low threshold voltage $V_{IL}$, to determine whether to generate the top bootstrap current $I_{TOP}$ and the bottom bootstrap current $I_{BOT}$ to be supplied to the OTA 502 according to the comparison result. The function of the comparator 500 is to supply an additional differential current to the OTA 502 when the load voltage signal $V_{LOAD}$ is not in a target voltage range between the high threshold voltage $V_{IH}$ and the low threshold voltage $V_{IL}$, to increase the settling speed of the load voltage signal $V_{LOAD}$, and thereby stabilizes the load voltage signal $V_{LOAD}$.

In detail, when the comparator 500 determines that the level of the load voltage signal $V_{LOAD}$ is in the target voltage range, $V_{IL} < V_{LOAD} < V_{IH}$, the comparator 500 does not output bootstrap currents, which means the magnitudes of the top bootstrap current $I_{TOP}$ and the bottom bootstrap current $I_{BOT}$ are substantially equal to zero. In such a condition, the OTA 502 is configured to convert an input voltage difference between the output voltage signal $V_{OUT}$ and the reference voltage $V_{REF}$ into the source current $I_{SOURCE}$ and the sink current $I_{SINK}$. The source current $I_{SOURCE}$ and the sink current $I_{SINK}$ may turn on the high-side transistor in the output stage circuit 504 to pull up the output voltage signal $V_{OUT}$ when the output voltage signal $V_{OUT}$ is lower than the reference voltage $V_{REF}$, and turn on the low-side transistor in the output stage circuit 504 to pull low the output voltage signal $V_{OUT}$ when the output voltage signal $V_{OUT}$ is higher than the reference voltage $V_{REF}$. The source current $I_{SOURCE}$ and the sink current $I_{SINK}$ may be in the same magnitude, which is equivalent to the product of a transconductance value (Gm) of the OTA 502 and the magnitude of the differential input voltage. The high-side transistor and the low-side transistor are in dynamically balance and fit a predetermined bias current when the level of the output voltage signal $V_{OUT}$ recovers to be equivalent to the reference voltage $V_{REF}$. When the load voltage signal $V_{LOAD}$ varies and becomes different from the reference voltage $V_{REF}$ the load voltage signal $V_{LOAD}$ may be quickly settled to the reference voltage $V_{REF}$ as long as the load voltage signal $V_{LOAD}$ is in the target voltage range. It is noted that the high threshold voltage $V_{IH}$ may be configured to be higher than the reference voltage $V_{REF}$, and the low threshold voltage $V_{IL}$ may be configured to be lower than the reference voltage $V_{REF}$.

When the comparator 500 determines that the load voltage signal $V_{LOAD}$ becomes lower than the low threshold voltage $V_{IL}$, the comparator 500 may generate the top bootstrap current $I_{TOP}$ and the bottom bootstrap current $I_{BOT}$ to the OTA 502 to affect the balance of the source current $I_{SOURCE}$ and the sink current $I_{SINK}$ and in such a condition, the source current $I_{SOURCE}$ and the sink current $I_{SINK}$ are controlled not based on the input voltage difference between the output voltage signal $V_{OUT}$ and the reference voltage $V_{REF}$ but based on the top bootstrap current $I_{TOP}$ and the bottom bootstrap current $I_{BOT}$. In such a condition, the source current $I_{SOURCE}$ and the sink current $I_{SINK}$ may turn on the high-side transistor to pull up the output voltage signal $V_{OUT}$, and the output voltage signal $V_{OUT}$ may be overdriven to a level higher than the reference voltage $V_{REF}$, such that the load voltage signal $V_{LOAD}$ is able to recover to be in the target voltage range. The comparator 500 stops outputting the top bootstrap current $I_{TOP}$ and the bottom bootstrap current $I_{BOT}$ after the load voltage signal $V_{LOAD}$ recovers to be in the target voltage range.

Similarly, when the comparator 500 determines that the load voltage signal $V_{LOAD}$ becomes higher than the high threshold voltage $V_{IH}$, the comparator 500 may generate the top bootstrap current $I_{TOP}$ and the bottom bootstrap current $I_{BOT}$ to the OTA 502 to affect the balance of the source current $I_{SOURCE}$ and the sink current $I_{SINK}$, and in such a condition, the source current $I_{SOURCE}$ and the sink current $I_{SINK}$ are controlled based on the top bootstrap current $I_{TOP}$ and the bottom bootstrap current $I_{BOT}$. The source current $I_{SOURCE}$ and the sink current $I_{SINK}$ may turn on the low-side transistor to pull down the output voltage signal $V_{OUT}$, and the output voltage signal $V_{OUT}$ may be overdriven to a level lower than the reference voltage $V_{REF}$, such that the load voltage signal $V_{LOAD}$ is able to recover to be in the target voltage range. The comparator 500 stops outputting the top bootstrap current $I_{TOP}$ and the bottom bootstrap current $I_{BOT}$ after the load voltage signal $V_{LOAD}$ recovers to be in the target voltage range.

Please note that the comparator 500 supplies one of the top bootstrap current $I_{TOP}$ and the bottom bootstrap current $I_{BOT}$ to the OTA 502 and draws the other one of the top bootstrap current $I_{TOP}$ and the bottom bootstrap current $I_{BOT}$ from the OTA 502 when the level of the load voltage signal $V_{LOAD}$ is higher than the high threshold voltage $V_{IH}$ or when the level of the load voltage signal $V_{LOAD}$ is lower than the low threshold voltage $V_{IL}$. In other words, regarding to the current direction, one of the top bootstrap current $I_{TOP}$ and the bottom bootstrap current $I_{BOT}$ is regarded as a source current and the other is regarded as a sink current. The source current and sink current are generated by the comparator 500 and may be different from the source current $I_{SOURCE}$ and the sink current $I_{SINK}$ outputted by the OTA 502. In an embodiment, when the level of the load voltage signal $V_{LOAD}$ is higher than the high threshold voltage $V_{IH}$, the comparator 500 may supply the top bootstrap current $I_{TOP}$ to the OTA 502 and draw the bottom bootstrap current $I_{BOT}$ from the OTA 502; and when the level of the load voltage signal $V_{LOAD}$ is lower than the low threshold voltage $V_{IL}$, the comparator 500 may supply the bottom bootstrap current $I_{BOT}$ to the OTA 502 and draw the top bootstrap current $I_{TOP}$ from the OTA 502. In another embodiment, when the level of the load voltage signal $V_{LOAD}$ is higher than the high threshold voltage $V_{IH}$, the comparator 500 may supply the bottom bootstrap current $I_{BOT}$ to the OTA 502 and draw the top bootstrap current $I_{TOP}$ from the OTA 502; and when the level of the load voltage signal $V_{LOAD}$ is lower than the low threshold voltage $V_{IL}$, the comparator 500 may supply the top bootstrap current $I_{TOP}$ to the OTA 502 and draw the bottom bootstrap current $I_{BOT}$ from the OTA 502.

Figure 1A:
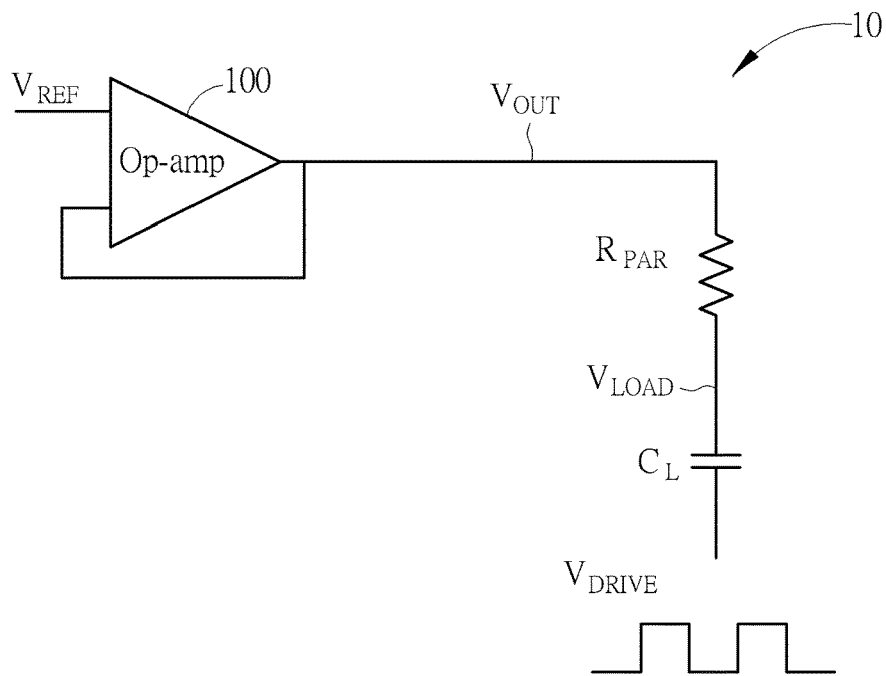
FIG. 1A is a schematic diagram of a circuit system including an op-amp according to the prior art.
Figure 1B:
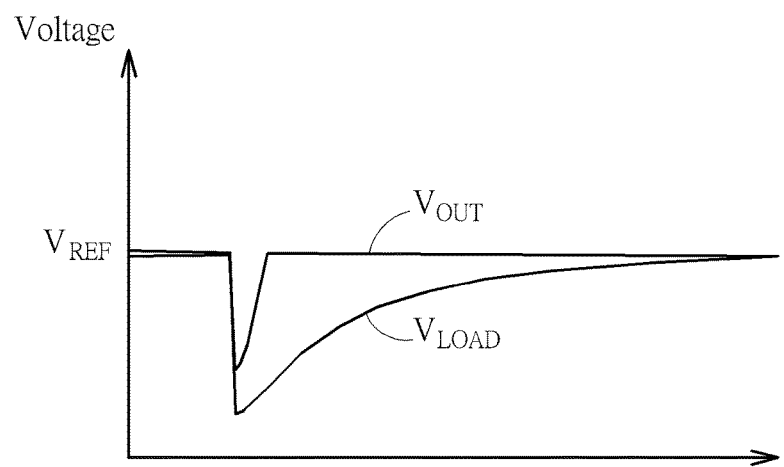
FIG. 1B illustrates the waveforms of the output voltage signal and the load voltage signal.
Figure 2A:
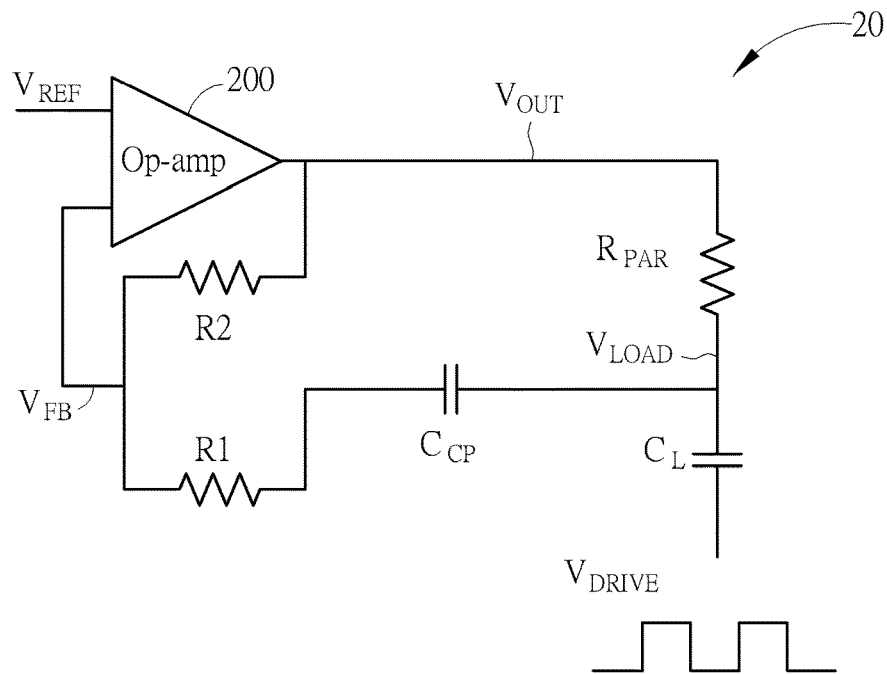
FIG. 2A is a schematic diagram of a circuit system including an op-amp according to the prior art.
Figure 2B:
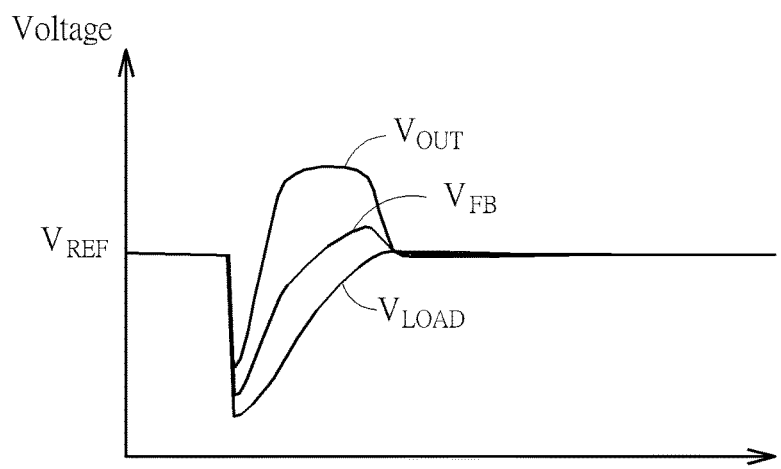
FIG. 2B illustrates the waveforms of the output voltage signal, the load voltage signal and the feedback signal.

As mentioned in the description of the prior art, an external RC feedback circuit is required to cooperate with the op-amp 200 of FIG. 2A to increase the settling speed of the load voltage signal which is influenced by the parasitic impedance and the signal coupling via the capacitive load. In comparison, the op-amp 50 of the present invention may increase the settling speed of the load voltage signal by using the current bootstrap comparator 500 without cooperating with an external RC feedback circuit.

Figure 7:
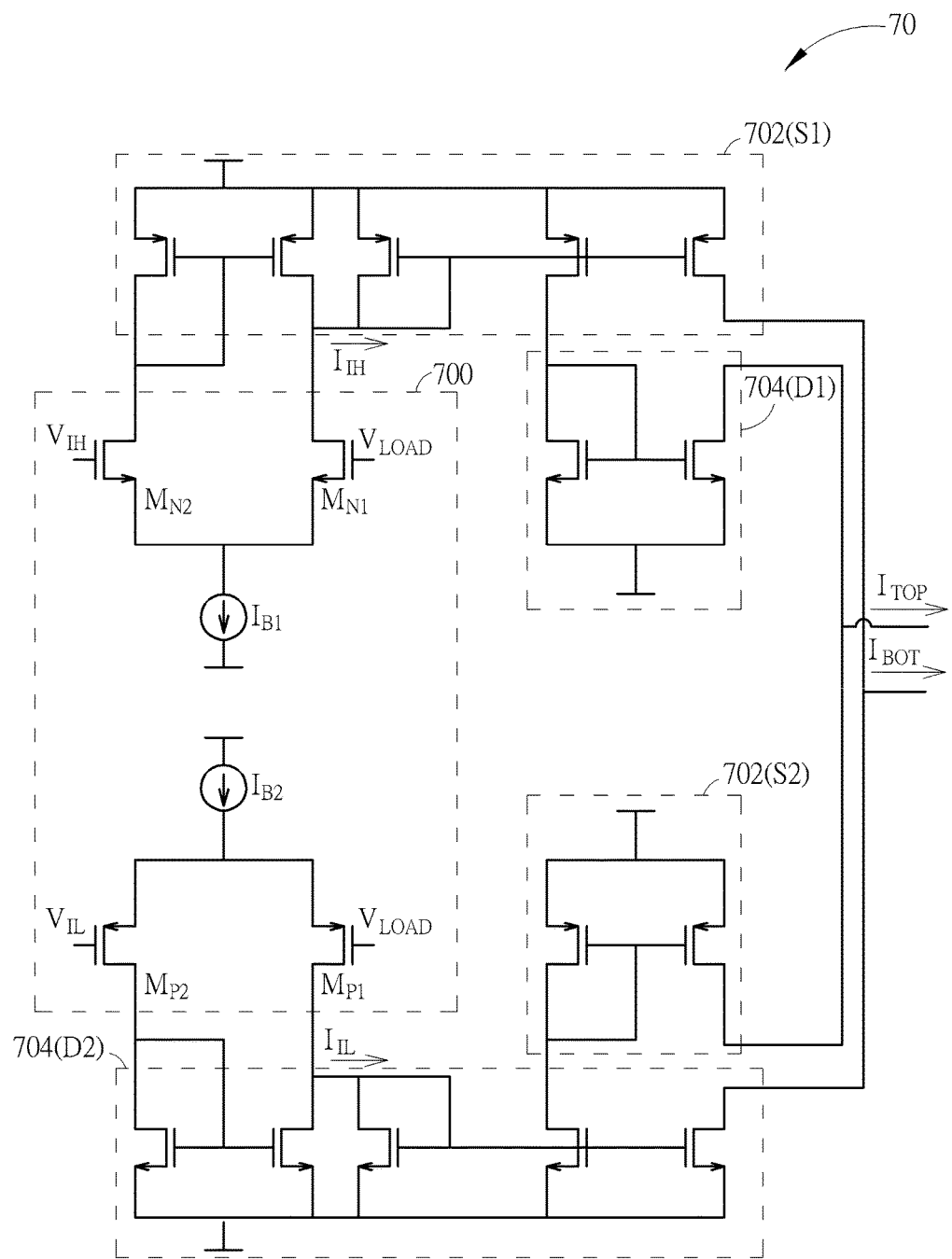
FIG. 7 is a schematic diagram of an exemplary circuit structure of a current-bootstrap comparator.

Please refer to FIG. 7, which is a schematic diagram of an exemplary circuit structure of a current-bootstrap comparator 70. As shown in FIG. 7, the current-bootstrap comparator 70 includes a receiving unit 700, a current supply unit 702 and a current draw unit 704. The receiving unit 700 receives the load voltage signal $V_{LOAD}$, the low threshold voltage $V_{IL}$ and the high threshold voltage $V_{IH}$. The current supply unit 702 is used for supplying a first current, as a source current, to a first output node of the current-bootstrap comparator 70 when the level of the load voltage signal $V_{LOAD}$ is higher than the high threshold voltage $V_{IH}$ or lower than the low threshold voltage $V_{IL}$, where the first current may be the top bootstrap current $I_{TOP}$ or the bottom bootstrap current $I_{BOT}$. The current draw unit 704 is used for drawing or sinking a second current, as a sink current, from a second output node of the current-bootstrap comparator 70 when the level of the load voltage signal $V_{LOAD}$ is higher than the high threshold voltage $V_{IH}$ or lower than the low threshold voltage $V_{IL}$, where the second current may be the top bootstrap current $I_{m}p$ or the bottom bootstrap current $I_{BOT}$.

In detail, the receiving unit 700 includes two differential input pairs and two current sources $I_{B1}$ and $I_{B2}$. Each of the differential input pairs is coupled to a corresponding current source. More specifically, a first differential input pair includes NMOS transistors $M_{N1}$ and $M_{N2}$, which are coupled to the current source $I_{B1}$. In the first differential input pair, the transistor $M_{N1}$ receives the load voltage signal $V_{LOAD}$ and the transistor $M_{N2}$ receives the high threshold voltage $V_{IH}$, in order to compare the load voltage signal $V_{LOAD}$ with the high threshold voltage $V_{IH}$. A second differential input pair includes PMOS transistors $M_{P1}$ and $M_{P2}$, which are coupled to the current source $I_{B2}$. In the second differential input pair, the transistor $M_{P1}$ receives the load voltage signal $V_{LOAD}$ and the transistor $M_{P2}$ receives the low threshold voltage $V_{IL}$, in order to compare the load voltage signal $V_{LOAD}$ with the low threshold voltage $V_{IL}$. In an embodiment, the current sources $I_{B1}$ and $I_{B2}$ may supply substantially the same magnitude of current.

The current supply unit 702 may include a first set of current supply transistors S1 and a second set of current supply transistors S2. The current draw unit 704 may include a first set of current draw transistors D1 and a second set of current draw transistors D2. When the level of the load voltage signal $V_{LOAD}$ is higher than the high threshold voltage $V_{IH}$, the first set of current supply transistors S1 supplies the first current and the first set of current draw transistors D1 sinks the second current, and in such a situation, the first current is the bottom bootstrap current $I_{BOT}$ and the second current is the top bootstrap current $I_{TOP}$. When the level of the load voltage signal $V_{LOAD}$ is lower than the low threshold voltage $V_{IL}$, the second set of current supply transistors S2 supplies the first current and the second set of current draw transistors D2 sinks the second current, and in such a situation, the first current is the top bootstrap current $I_{TOP}$ and the second current is the bottom bootstrap current $I_{BOT}$.

Figure 8A:
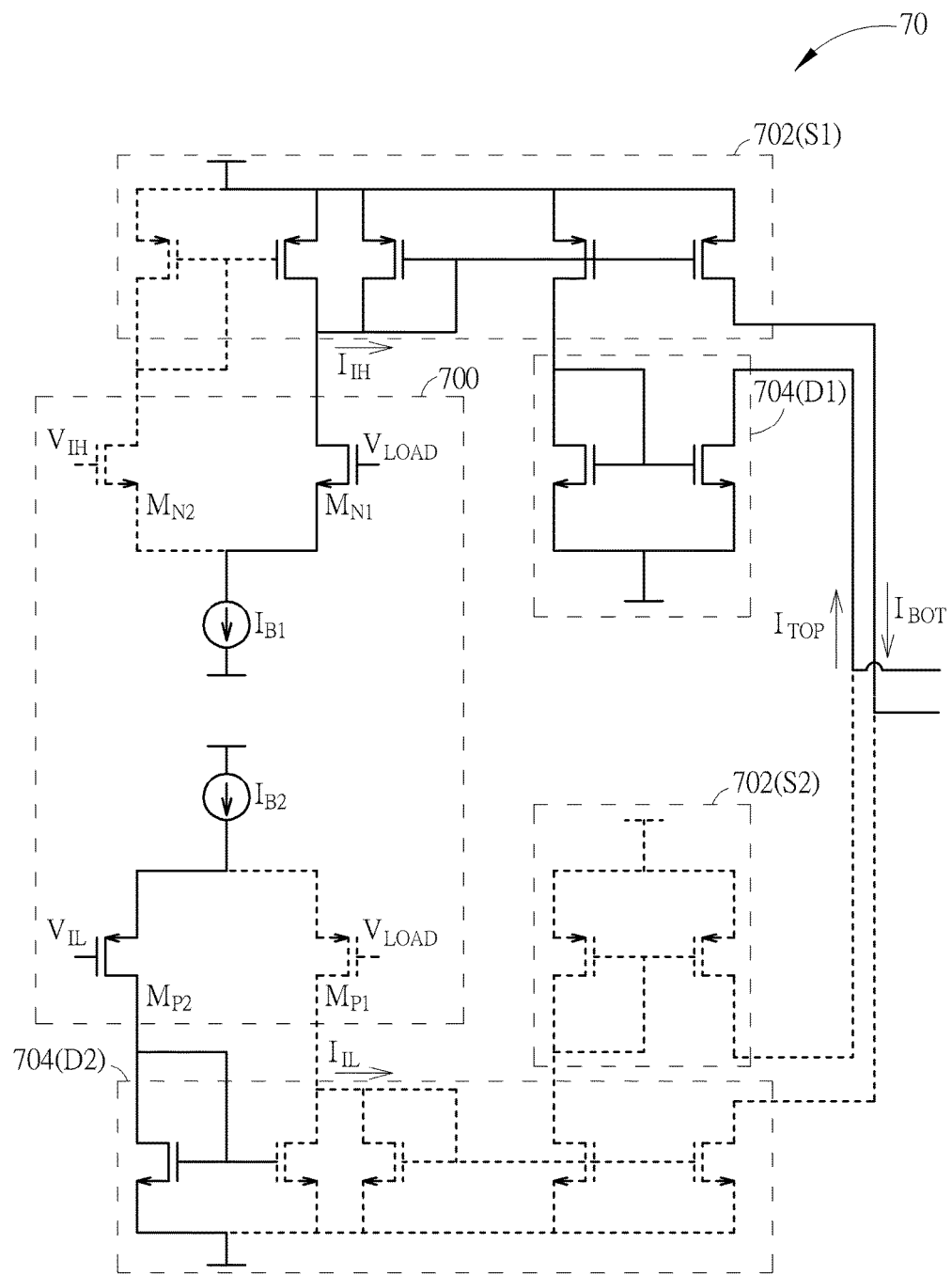
FIG. 8A is a schematic diagram of detailed operations of the current-bootstrap comparator when the level of the load voltage signal is higher than the high threshold voltage.

Please refer to FIG. 8A, which is a schematic diagram of detailed operations of the current-bootstrap comparator 70 when the level of the load voltage signal $V_{LOAD}$ is higher than the high threshold voltage $V_{IH}$. As shown in FIG. 8A, when the level of the load voltage signal $V_{LOAD}$ is higher than the high threshold voltage $V_{IH}$, the transistors $M_{P2}$ and $M_{N1}$ are turned on and the transistors $M_{P1}$ and $M_{N2}$ are turned off, and most currents from the current source $I_{B1}$ may flow through the transistor $M_{N1}$ and thereby generate a current $I_{IH}$. The first set of current supply transistors S1 then mirrors the current $I_{IH}$ to an output node of the current-bootstrap comparator 70, to supply the bottom bootstrap current $I_{BOT}$ to the next-stage circuit. The first set of current draw transistors D1 further mirrors the current $I_{IH}$ to another output node of the current-bootstrap comparator 70, to sink the top bootstrap current $I_{TOP}$ from the next-stage circuit. At this moment, since the level of the load voltage signal $V_{LOAD}$ is also higher than the low threshold voltage $V_{IL}$, most currents from the current source $I_{B2}$ may flow through the transistor $M_{P2}$, and thus no currents will be mirrored to the output nodes of the current-bootstrap comparator 70 via the second set of current supply transistors S2 and the second set of current draw transistors D2 (the lower half part of the circuit of the current-bootstrap comparator 70). Note that the device dimensions of current mirrors in the first set of current supply transistors S1 and the first set of current draw transistors D1 are predefined, allowing the magnitude of the supplied bottom bootstrap current $I_{BOT}$ to be substantially equal to the magnitude of the sunk top bootstrap current $I_{TOP}$, where the bottom bootstrap current $I_{BOT}$ and the top bootstrap current $I_{TOP}$ are in reverse directions.

Figure 8B:
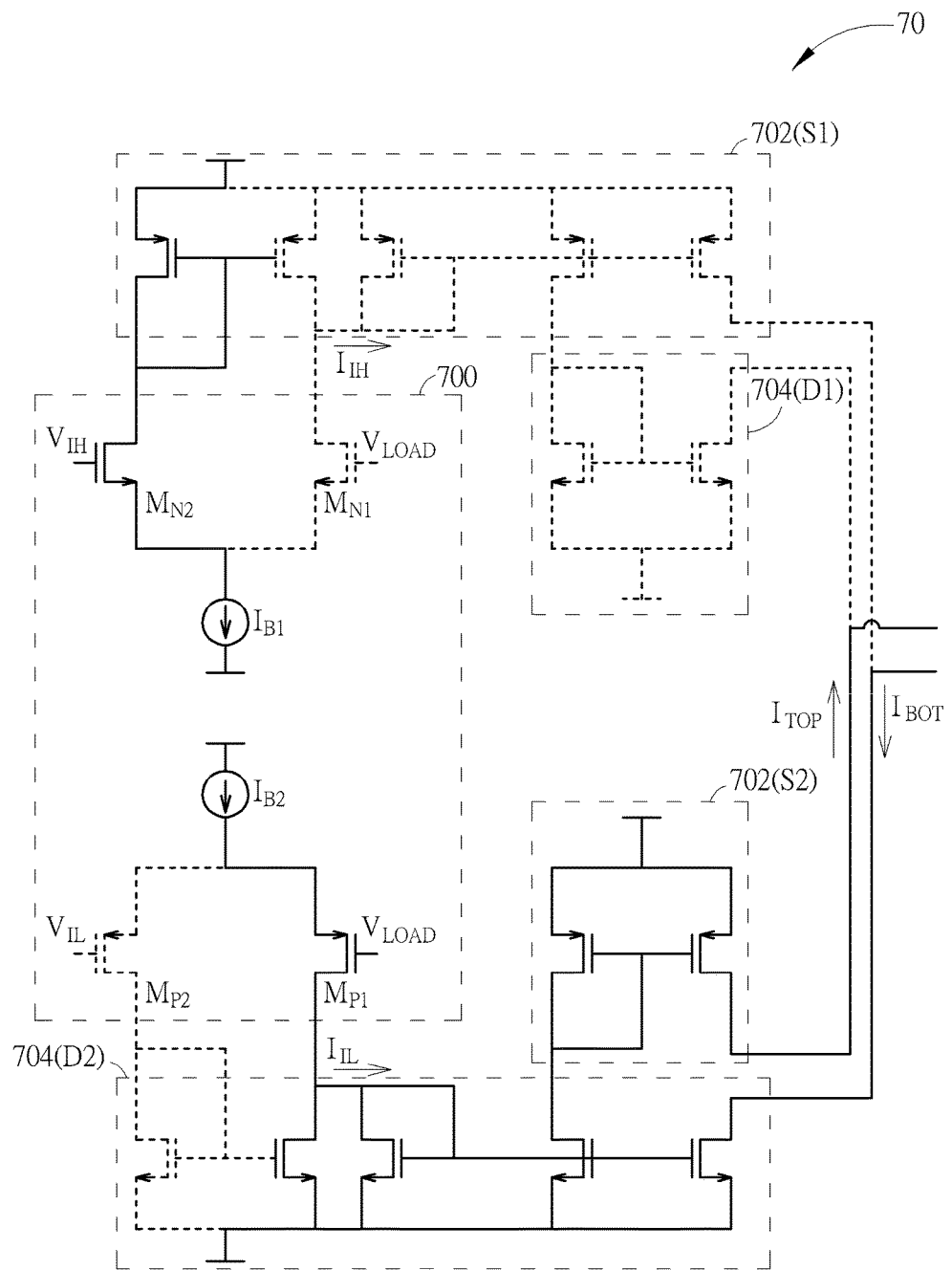
FIG. 8B is a schematic diagram of detailed operations of the current-bootstrap comparator when the level of the load voltage signal is lower than the low threshold voltage.

Please refer to FIG. 8B, which is a schematic diagram of detailed operations of the current-bootstrap comparator 70 when the level of the load voltage signal $V_{LOAD}$ is lower than the low threshold voltage $V_{IL}$. As shown in FIG. 8B, when the level of the load voltage signal $V_{LOAD}$ is lower than the low threshold voltage $V_{IL}$, the transistors $M_{N2}$ and $M_{P1}$ are turned on and the transistors $M_{N1}$ and $M_{P2}$ are turned off, and most currents from the current source $I_{B2}$ may flow through the transistor $M_{P1}$ and thereby generate a current $I_{IL}$. The second set of current draw transistors D2 then mirrors the current $I_{IL}$ to an output node of the current-bootstrap comparator 70, to sink the bottom bootstrap current $I_{BOT}$ from the next-stage circuit. The second set of current supply transistors S2 further mirrors the current $I_{IL}$ to another output node of the current-bootstrap comparator 70, to supply the top bootstrap current $I_{TOP}$ to the next-stage circuit. At this moment, since the level of the load voltage signal $V_{LOAD}$ is also lower than the high threshold voltage $V_{IH}$, most currents from the current source $I_{B1}$ may flow through the transistor $M_{N2}$, and thus no currents will be mirrored to the output nodes of the current-bootstrap comparator 70 via the first set of current supply transistors S1 and the first set of current draw transistors D1 (the upper half part of the circuit of the current-bootstrap comparator 70). Note that the device dimensions of current mirrors in the second set of current draw transistors D2 and the second set of current supply transistors S2 are predefined, allowing the magnitude of the supplied top bootstrap current $I_{TOP}$ to be substantially equal to the magnitude of the sunk bottom bootstrap current $I_{BOT}$, where the top bootstrap current $I_{TOP}$ and the bottom bootstrap current $I_{BOT}$ are in reverse directions.

When the level of the load voltage signal $V_{LOAD}$ is between the high threshold voltage $V_{IH}$ and the low threshold voltage $V_{IL}$, the transistors $M_{N2}$ and $M_{P2}$ are turned on and the transistors $M_{N1}$ and $M_{P1}$ are turned off, and $I_{IH}=I_{IL}=0$ such that the current supply unit 702 may not supply the first current to the next-stage circuit, and the current draw unit 704 may not draw the second current from the next-stage circuit. In other words, both of the top bootstrap current $I_{TOP}$ and the bottom bootstrap current $I_{BOT}$ are zero when the level of the load voltage signal $V_{LOAD}$ is between the high threshold voltage $V_{IH}$ and the low threshold voltage $V_{IL}$. In such a situation, the current-bootstrap comparator 70 may not affect the operations of the next-stage circuit, i.e., the OTA of the op-amp.

Figure 9A:
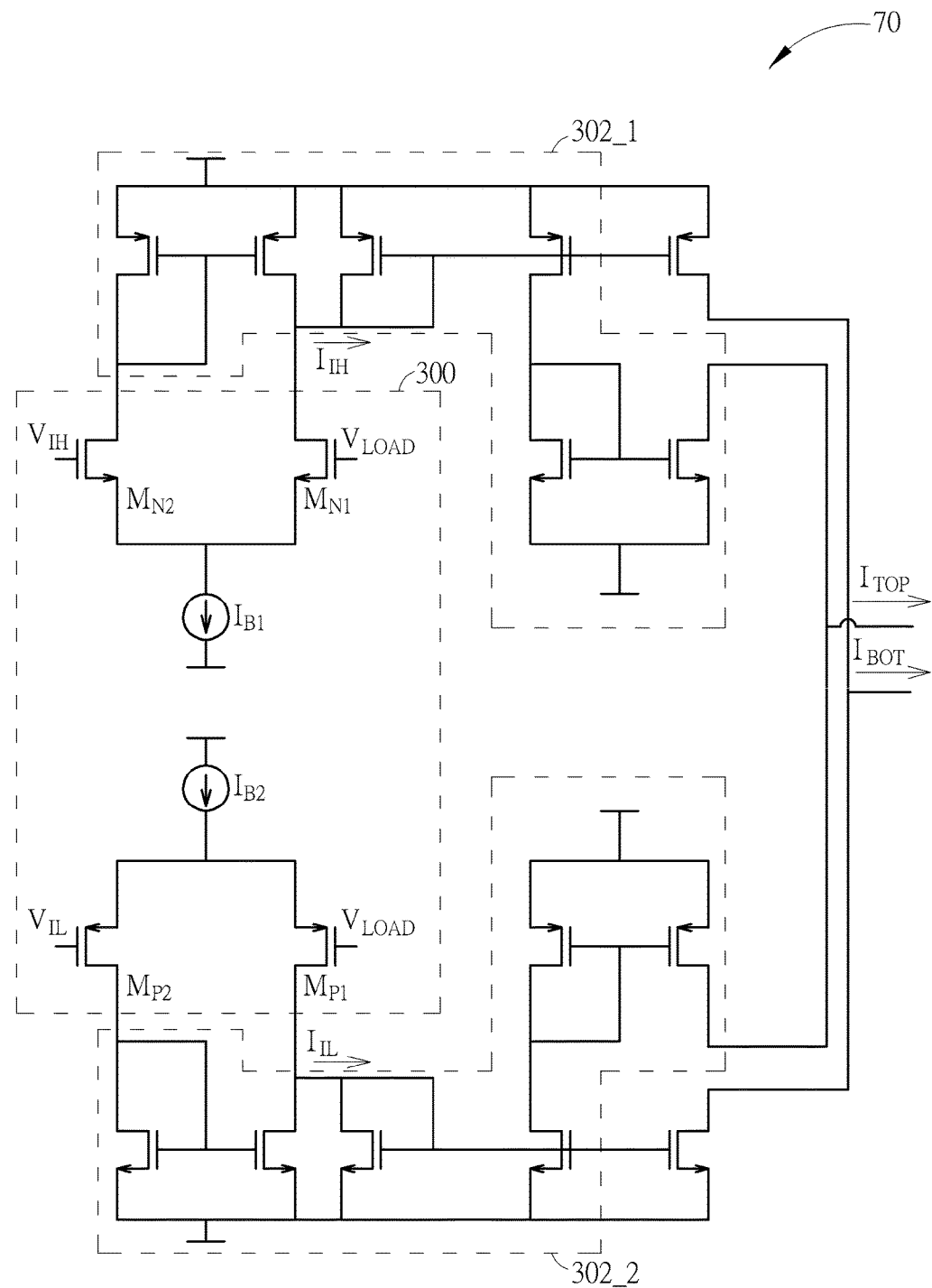
FIG. 9A is a schematic diagram of an exemplary circuit structure of the current-bootstrap comparator shown in FIG. 3.
Figure 9B:
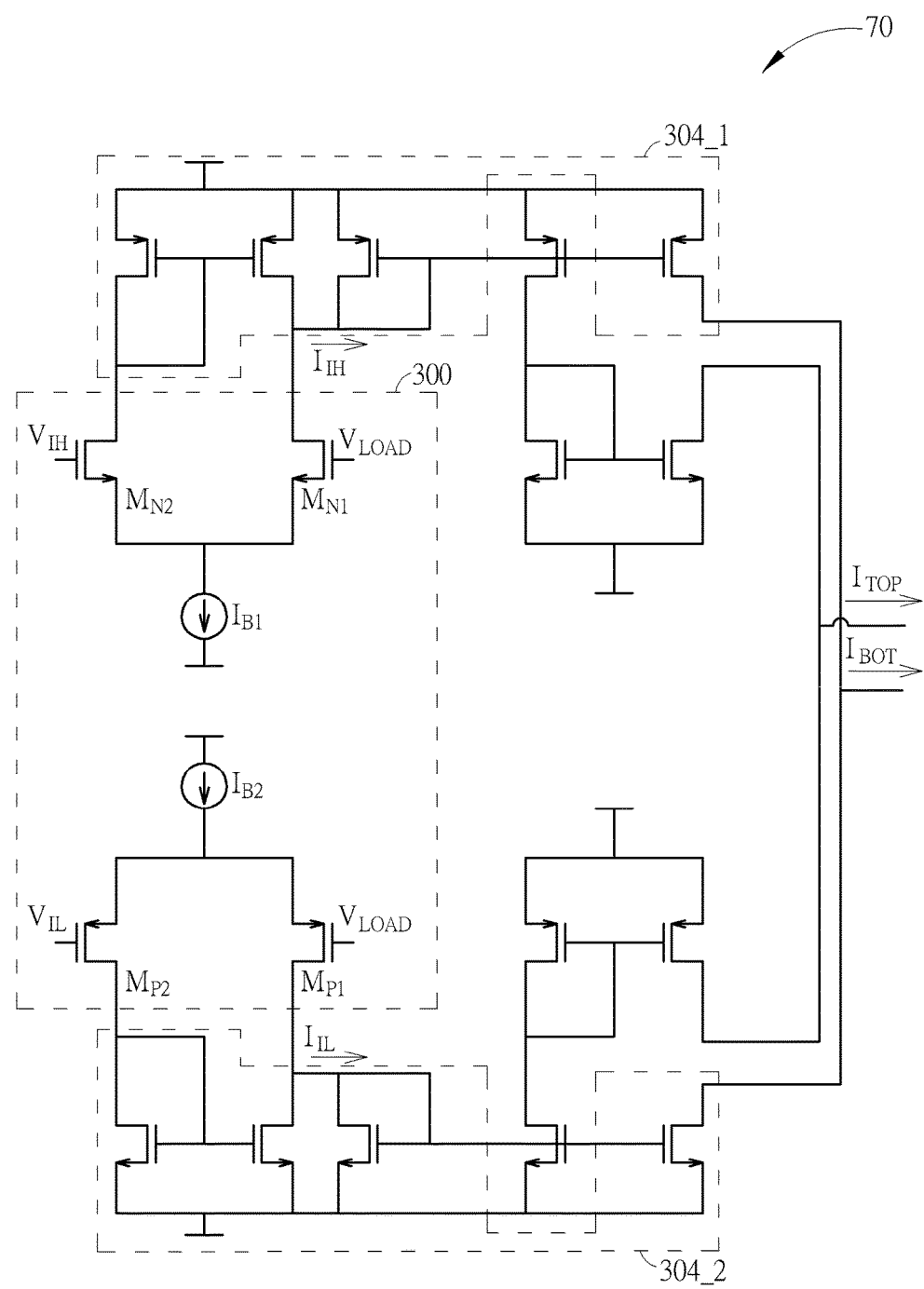
FIG. 9B is a schematic diagram of an exemplary circuit structure of the current-bootstrap comparator shown in FIG. 3.

Please refer to FIGS. 9A and 9B. The current-bootstrap comparator 70 of FIGS. 9A and 9B may be an embodiment of the current-bootstrap comparator 30 of FIG. 3. The current-bootstrap comparator 70 may include the receiving unit 300 (similar to the receiving unit 700), the current generation unit 302 for generating the top bootstrap current $I_{TOP}$ shown in FIG. 9A, and the current generation unit 304 for generating the bottom bootstrap current $I_{BOT}$, shown in FIG. 9B. The current generation unit 302 may include a first portion 302_1 and a second portion 302_2. The top bootstrap current $I_{TOP}$ is generated from the first portion 302_1 when the level of the load voltage signal $V_{LOAD}$ is higher than the high threshold voltage $V_{IH}$, or generated from the second portion 302_2 when the level of the load voltage signal $V_{LOAD}$ is lower than the low threshold voltage $V_{IL}$. The current generation unit 304 may include a first portion 304_1 and a second portion 304_2. The bottom bootstrap current $I_{BOT}$ is generated from the first portion 304_1 when the level of the load voltage signal $V_{LOAD}$ is higher than the high threshold voltage $V_{IH}$, or generated from the second portion 304_2 when the level of the load voltage signal $V_{LOAD}$ is lower than the low threshold voltage $V_{IL}$. Detailed operations of the current generation units 302 and 304 are illustrated in FIG. 3 and related paragraphs, and will not be narrated herein.

Please note that the circuit structure of the current-bootstrap comparator 70 shown in FIG. 7 is only one of various possible embodiments of the present invention. In another embodiment, if the operations of the current-bootstrap comparator 70 are determined only based on the voltage level relations between the load voltage signal $V_{LOAD}$ and the high threshold voltage $V_{IH}$, the current-bootstrap comparator 70 may only include the differential input pair of transistors $M_{N1}$ and $M_{N2}$, the current source $I_{B1}$, the first set of current supply transistors S1, and the first set of current draw transistors D1. In this embodiment, the differential input pair of transistors $M_{P1}$ and $M_{P2}$, the current source $I_{B2}$, the second set of current draw transistors D2, and the second set of current supply transistors S2 may be omitted. Alternatively, if the operations of the current-bootstrap comparator 70 are determined only based on the voltage level relations between the load voltage signal $V_{LOAD}$ and the low threshold voltage $V_{IL}$, the current-bootstrap comparator 70 may only include the differential input pair of transistors $M_{P1}$ and $M_{P2}$, the current source $I_{B2}$, the second set of current draw transistors D2, and the second set of current supply transistors S2. In this embodiment, the differential input pair of transistors $M_{N1}$ and $M_{N2}$, the current source $I_{B2}$, the first set of current supply transistors S1, and the first set of current draw transistors D1 may be omitted.

Figure 10:
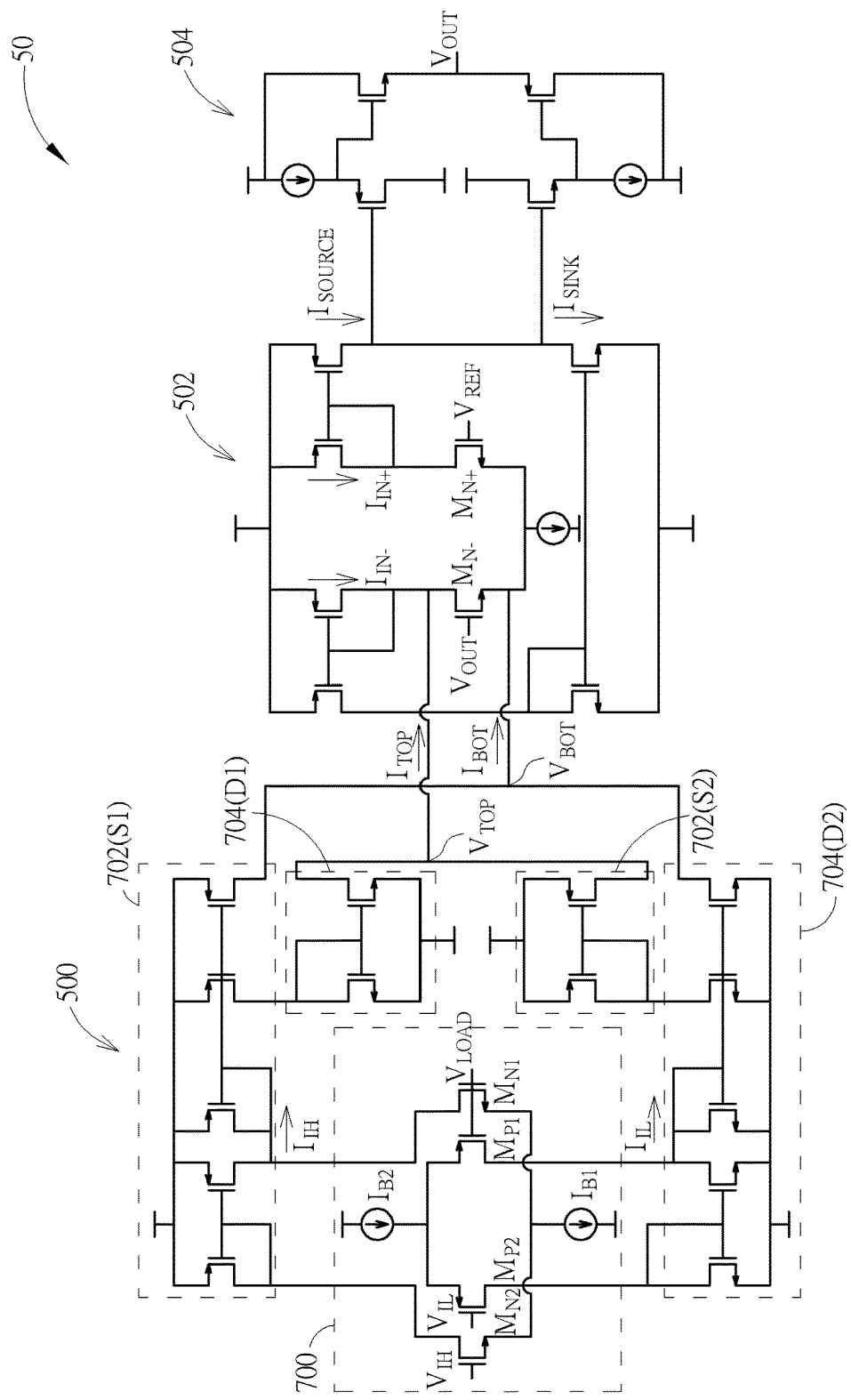
FIG. 10 is a schematic diagram of an exemplary circuit structure of the op-amp shown in FIG. 5.

Please refer to FIG. 10, which is a schematic diagram of an exemplary circuit structure of the op-amp 50 shown in FIG. 5. As shown in FIG. 10, the circuit structure of the current-bootstrap comparator 70 shown in FIG. 7 is incorporated as the comparator 500. The top bootstrap current $I_{TOP}$ and the bottom bootstrap current $I_{BOT}$ are generated when the comparator 500 determines that the level of the load voltage signal $V_{LOAD}$ is higher than the high threshold voltage $V_{IH}$ or lower than the low threshold voltage $V_{IL}$. The OTA 502 may be implemented in a circuit structure having a high output common mode range (OCMR) and generates the source current $I_{SOURCE}$ and the sink current $I_{SINK}$ according to reception of the output voltage signal $V_{OUT}$ and the reference voltage $V_{REF}$, and also according to the top bootstrap current $I_{TOP}$ and the bottom bootstrap current $I_{BOT}$. The output stage circuit 504 may have a common-drain class-AB structure and then outputs the output voltage signal $V_{OUT}$ and controls the output voltage signal $V_{OUT}$ via the source current $I_{SOURCE}$ and the sink current $I_{SINK}$. Detailed circuit structure of the OTA 502 and the output stage circuit 504 are well known by those skilled in the art, and will not be narrated herein.

When the level of the load voltage signal $V_{LOAD}$ is lower than the low threshold voltage $V_{IL}$, the transistors $M_{N2}$ and $M_{P1}$ are turned on and the transistors $M_{N1}$ and $M_{P2}$ are turned off, such that the top bootstrap current $I_{TOP}$ may be a source current (supplied to the OTA 502) and the bottom bootstrap current $I_{BOT}$ may be a sink current (drawn from the OTA 502). In such a condition, the level of a voltage signal $V_{TOP}$ increases and the level of a voltage signal $V_{BOT}$ decreases, and correspondingly a current $I_{IN-}$ is approximate to zero and a current $I_{IN+}$ increases, which leads to an equivalent result that a transistor $M_{N-}$ is turned off, and finally the sink current $I_{SINK}$ is approximate to zero and the source current $I_{SOURCE}$ increases. In such a condition, even though the output voltage signal $V_{OUT}$ reaches at the reference voltage $V_{REF}$, the OTA 502 does not return to the current balance state ($|I_{SOURCE}|=|I_{SINK}|$) and the OTA 502 keeps outputting the source current $I_{SOURCE}$ to overdrive the load voltage signal $V_{LOAD}$. Until the load voltage signal $V_{LOAD}$ recovers to be in the target voltage range, the comparator 500 stops outputting the bootstrap currents $I_{TOP}$ and $I_{BOT}$.

When the level of the load voltage signal $V_{LOAD}$ is higher than the high threshold voltage $V_{IH}$, the transistors $M_{P2}$ and $M_{N1}$ are turned on and the transistors $M_{P1}$ and $M_{N2}$ are turned off, such that the top bootstrap current $I_{TOP}$ may be a sink current (drawn from the OTA 502) and the bottom bootstrap current $I_{BOT}$ maybe a source current (supplied to the OTA 502). In such a condition, the level of the voltage signal $V_{TOP}$ decreases and the level of the voltage signal $V_{BOT}$ increases, and correspondingly the current $I_{IN+}$ is approximate to zero and the current $I_{IN-}$ increases, which leads to an equivalent result that the transistor $M_{N-}$ is turned on, and finally the source current $I_{SOURCE}$ is approximate to zero and the sink current $I_{SINK}$ increases. In such a condition, even though the output voltage signal $V_{OUT}$ reaches at the reference voltage $V_{REF}$, the OTA 502 does not return to the current balance state and the OTA 502 keeps outputting the sink current $I_{SINK}$ to overdrive the load voltage signal $V_{LOAD}$. Until the load voltage signal $V_{LOAD}$ recovers tobe in the target voltage range, the comparator 500 stops outputting the bootstrap currents $I_{TOP}$ and $I_{BOT}$.

It should be noted that the comparator 500 being coupled to the transistor $M_{N-}$ to influence the current $I_{IN-}$ as illustrated in FIG. 10 is one of embodiments of the present invention. In another embodiment, the two output nodes of the comparator 500 may be coupled to other proper nodes in the OTA 502 as long as the top bootstrap current $I_{TOP}$ and the bottom bootstrap current $I_{BOT}$ outputted by the comparator 500 can influence the source current $I_{SOURCE}$ and the sink current $I_{SINK}$.

Please note that the present invention aims at providing a current-bootstrap comparator and an op-amp including the current-bootstrap comparator. The current-bootstrap comparator is capable of generating a top bootstrap current and a bottom bootstrap current having the same magnitude and reverse directions, and outputting one of the top bootstrap current and the bottom bootstrap current to the op-amp and receiving the other one from the op-amp. Those skilled in the art can make modifications and alternations accordingly. For example, in the above embodiments, only one pair of top bootstrap current and bottom bootstrap current is generated by the current-bootstrap comparator. In another embodiment, the current-bootstrap comparator may generate multiple pairs of top bootstrap current and bottom bootstrap current for different structures of op-amp. In addition, multiple high threshold voltages and low threshold voltages maybe incorporated to determine the level of the load voltage signal. The magnitudes of the top bootstrap current and bottom bootstrap current may be higher if the level of the load voltage signal exceeds more threshold voltages. Note that the current-bootstrap comparator of the present invention may be applied to any type of op-amp having any OTA structure, e.g., the folded-cascode input pair, or any output stage circuit structure, e.g., the class-A, class-B or class-AB. In fact, any op-amp that is composed of an OTA and an output stage circuit can apply the current-bootstrap comparator of the present invention to stabilize the voltage level of the load voltage signal.

Figure 11:
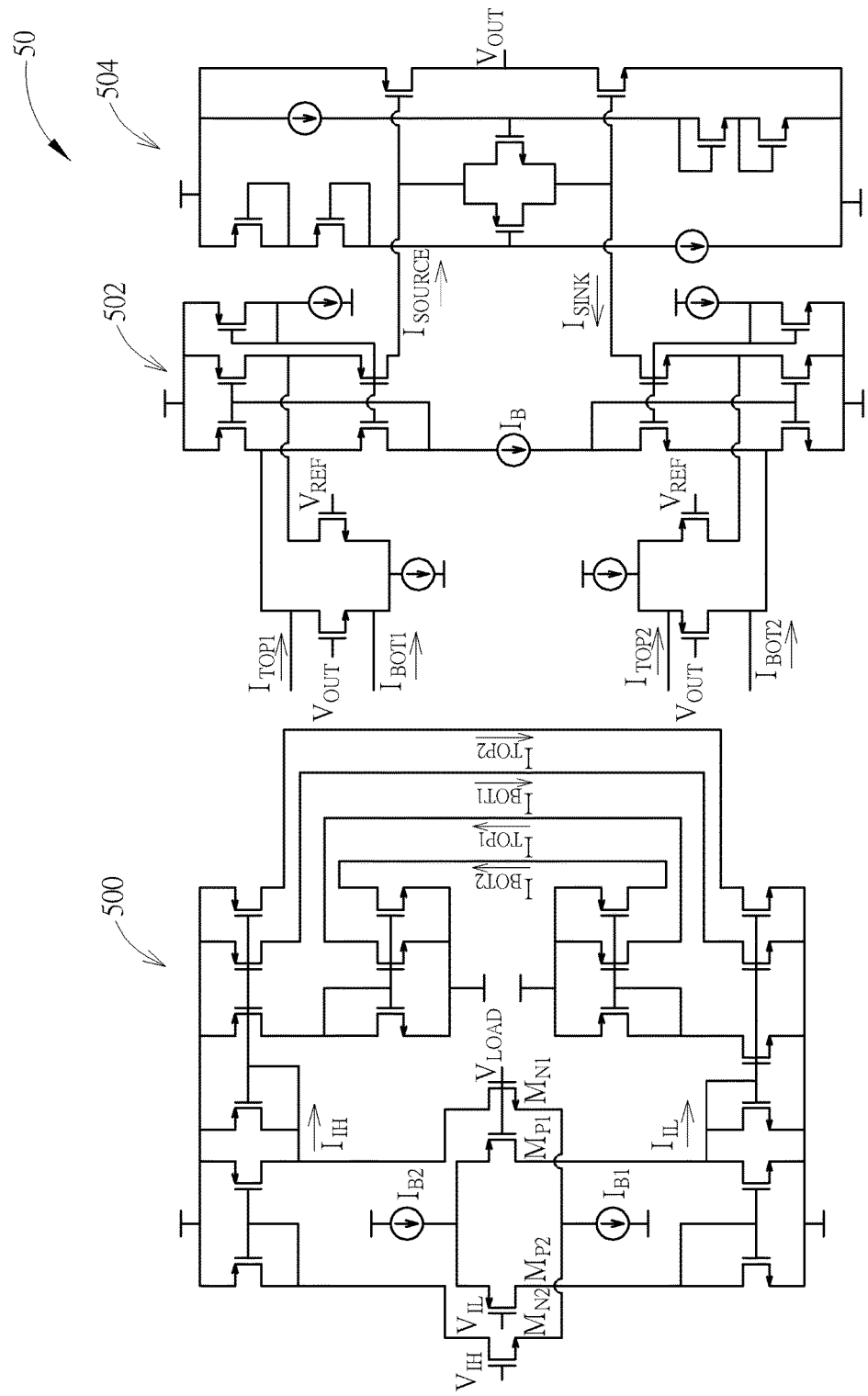
FIG. 11 is a schematic diagram of another exemplary circuit structure of the op-amp shown in FIG. 5.

Please refer to FIG. 11, which is a schematic diagram of another exemplary circuit structure of the op-amp 50 shown in FIG. 5. As shown in FIG. 11, the comparator 500 may include two pairs of top bootstrap currents $I_{TOP1}$, $I_{TOP2}$ and bottom bootstrap currents $I_{BOT1}$, $I_{BOT2}$, and the OTA 502 may have a rail-to-rail folded-cascode structure. The two pairs of bootstrap currents are respectively outputted to the upper differential input pair and the lower differential input pair of the OTA 502. The output stage circuit 504 may have a common-source class-AB structure. The detailed operations of the comparator 500 are described above and the detailed operations of the OTA 502 and the output stage circuit 504 can be derived based on the operations of the op-amp in FIG. 10; these will not be narrated herein.

As shown in FIGS. 10 and 11, the top bootstrap currents and the bottom bootstrap currents are outputted to the differential input pairs of the OTA. In another embodiment, the top bootstrap current and the bottom bootstrap current may be outputted to any nodes of the OTA. More specifically, the top bootstrap current and the bottom bootstrap current are used for affecting the source current $I_{SOURCE}$ and the sink current $I_{SINK}$ outputted by the OTA. Therefore, as long as the source current and the sink current of the OTA can be affected by the top bootstrap current and the bottom bootstrap current, it is feasible to output the top bootstrap current and the bottom bootstrap current to any nodes of the OTA.

Please note that a current-bootstrap comparator is incorporated with an op-amp, and the current-bootstrap comparator is used for affecting the balance of the op-amp by outputting the top bootstrap current and the bottom bootstrap current to the OTA of the op-amp when the voltage level of the load voltage signal is far from its target voltage range, which usually happens in the far end from the op-amp. For example, with the current-bootstrap comparator, when the load voltage signal is too low while the output voltage signal substantially equals the reference voltage, the current-bootstrap comparator may output the top bootstrap current and the bottom bootstrap current to the OTA, and thereby changes the source current and the sink current outputted by the OTA. Therefore, the source current and the sink current outputted by the OTA may still affect the gate voltage of the output transistors in the output stage circuit, such that the output voltage signal is increased to a higher level and thereby the load voltage signal is settled more rapidly.

The top bootstrap current and the bottom bootstrap current affects the differential signals of the op-amp rather than the common mode signal. Since the top bootstrap current and the bottom bootstrap current have the same magnitude and reverse directions, one of the bootstrap currents may flow into the OTA via one node and the other current with the same magnitude may flow out from the OTA via another node. That is, these bootstrap currents affect the differential signals while the common mode characteristics of the op-amp, e.g., the entire current of the op-amp, do not change. As can be seen, the current-bootstrap mechanism of the present invention is different from any other current increasing or gain enhancement mechanism of the op-amp. Note that the gain enhancement may be achieved by increasing the common mode current of the op-amp, e.g., increasing a tail current, which does not affect the differential signal of the op-amp or change the balance of the op-amp.

Based on FIG. 6, when the op-amp 50 are used in a display driver integrated circuit (IC) and is used for generating a common voltage VCOM, the capacitive load $C_L$ may include capacitors coupled to the common voltage node, and the parasitic impedance $R_{PAR}$ may exist in the connection wire between the output node of the op-amp 50 and a terminal (as the common voltage node) of the capacitive load $C_L$. In another example, when the op-amp 50 is used in an IC for generating a voltage providing to other circuit in the IC, the capacitive load $C_L$ maybe regarded as the parasitic capacitor between the output node of the op-amp 50 and its load where the generated voltage is supplied to.

In the prior art, even though using an op-amp cooperating with an external RC feedback circuit improves the settling speed of the load voltage signal, the stability of the op-amp may be affected by the RC feedback circuit. The external coupling capacitor occupies a large area and requires a higher cost. In contrast, the embodiments of the present invention provide a current-bootstrap comparator and an op-amp that a current-bootstrap comparator is implemented within. The current-bootstrap comparator may receive the load voltage signal, and control the source current and the sink current of the OTA by outputting one of a top bootstrap current and a bottom bootstrap current to the OTA and receiving the other one from the OTA when the load voltage signal is out of the target voltage range. Therefore, the load voltage signal may be settled to its target voltage more rapidly. In such a situation, the voltage level of the load voltage signal may be stabilized without the usage of external circuit elements such as external capacitors, so that the circuit area and circuit cost maybe saved. Besides, the current-bootstrap comparator may not take effect when the load voltage signal is in the target voltage range, e.g., the range between the high threshold voltage and the low threshold voltage, so the current-bootstrap comparator may not affect the stability and noise immunity of the op-amp. Any circuit structure having an op-amp used to drive a load may apply the current-bootstrap comparator of the present invention, to achieve the stability of the load voltage signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current-bootstrap comparator, comprising:
a receiving unit, for receiving a load voltage signal, a low threshold voltage and a high threshold voltage;
a first current generation unit, for generating a first current; and
a second current generation unit, for generating a second current, which has a magnitude substantially same as a magnitude of the first current and has a direction reverse to the first current;
wherein one of the first current and the second current is supplied to a next-stage circuit as a source current and the other is supplied to the next-stage circuit as a corresponding sink current, when the level of the load voltage signal is higher than the high threshold voltage or when the level of the load voltage signal is lower than the low threshold voltage; and
wherein the magnitudes of the first current and the second current are substantially equal to zero when the level of the load voltage signal is between the high threshold voltage and the low threshold voltage.

2. An operational amplifier (op-amp), comprising:
a comparator for receiving a load voltage signal, a low threshold voltage and a high threshold voltage and generating a first current and a second current according to a voltage region which the level of the load voltage signal is in, wherein the first current and the second current are in reverse directions;
an operational transconductance amplifier (OTA), comprising a first node for receiving a reference voltage, a second node for receiving an output voltage signal of the op-amp, a third node for receiving or outputting the first current, and a fourth node for receiving or outputting the second current, and configured to generate a source current and a sink current; and
an output stage circuit for outputting the output voltage signal and controlling the output voltage signal via the source current and the sink current of the OTA.

3. The op-amp of claim 2, wherein the comparator supplies one of the first current and the second current to the OTA and draws the other one of the first current and the second current from the OTA when the level of the load voltage signal is higher than the high threshold voltage or when the level of the load voltage signal is lower than the low threshold voltage.

4. The op-amp of claim 2, wherein the magnitudes of the first current and the second current are substantially equal to zero when the level of the load voltage signal is between the high threshold voltage and the low threshold voltage.

5. The op-amp of claim 2, wherein the OTA is configured to convert a differential input voltage, which is the difference between the level of the output voltage signal and the reference voltage, into the source current and the sink current, when the level of the load voltage signal is between the high threshold voltage and the low threshold voltage.

6. The op-amp of claim 5, wherein the source current and the sink current of the OTA are in the same magnitude which is equivalent to the product of a transconductance value of the OTA and the magnitude of the differential input voltage.

7. The op-amp of claim 2, wherein the first current and the second current change a differential signal in the OTA when the level of the load voltage signal is higher than the high threshold voltage or lower than the low threshold voltage.

8. The op-amp of claim 2, wherein the first current and the second current change the source current and the sink current of the OTA when the level of the load voltage signal is higher than the high threshold voltage or lower than the low threshold voltage.

9. A current-bootstrap comparator, comprising:
a receiving unit, for receiving a load voltage signal, a low threshold voltage and a high threshold voltage;
a current supply unit, for supplying a first current to a first output node of the current-bootstrap comparator when the level of the load voltage signal is higher than the high threshold voltage or lower than the low threshold voltage; and
a current draw unit, for drawing a second current from a second output node of the current-bootstrap comparator when the level of the load voltage signal is higher than the high threshold voltage or lower than the low threshold voltage.

10. The current-bootstrap comparator of claim 9, wherein the receiving unit comprises a first differential input pair for receiving the load voltage signal and the high threshold voltage and a second differential input pair for receiving the load voltage signal and the low threshold voltage.

11. The current-bootstrap comparator of claim 10, wherein the first differential input pair is coupled to a first current source and the second differential input pair is coupled to a second current source, and the first current source and the second current source supply substantially the same magnitude of current.

12. The current-bootstrap comparator of claim 9, wherein the first current and the second current are in reverse directions and a magnitude of the first current is substantially equal to a magnitude of the second current.

13. The current-bootstrap comparator of claim 9, wherein the current supply unit does not supply the first current and the current draw unit does not draw the second current when the level of the load voltage signal is between the high threshold voltage and the low threshold voltage.

14. The current-bootstrap comparator of claim 9, wherein the current supply unit comprises at least one of a first set of current supply transistors and a second set of current supply transistors, the first set of current supply transistors supplies the first current when the level of the load voltage signal is higher than the high threshold voltage, and the second set of current supply transistors supplies the first current when the level of the load voltage signal is lower than the low threshold voltage.

15. The current-bootstrap comparator of claim 9, wherein the current draw unit comprises at least one of a first set of current draw transistors and a second set of current draw transistors, the first set of current draw transistors sinks the second current when the level of the load voltage signal is higher than the high threshold voltage, and the second set of current draw transistors sinks the second current when the level of the load voltage signal is lower than the low threshold voltage.

16. An operational amplifier (op-amp), comprising:
an operational transconductance amplifier (OTA), comprising a first node for receiving a reference voltage, a second node for receiving an output voltage signal of the op-amp, a third node for receiving a first current, and a fourth node for outputting a second current, and configured to generate a source current and a sink current;
an output stage circuit for outputting the output voltage signal and controlling the output voltage signal via the source current and the sink current of the OTA; and
a current-bootstrap comparator, comprising:
a receiving unit, for receiving a load voltage signal, a low threshold voltage and a high threshold voltage;
a current supply unit, for supplying the first current to the OTA when the level of the load voltage signal is higher than the high threshold voltage or lower than the low threshold voltage; and
a current draw unit, for drawing the second current from the OTA when the level of the load voltage signal is higher than the high threshold voltage or lower than the low threshold voltage.

17. The op-amp of claim 16, wherein the OTA is configured to convert a differential input voltage, which is the difference between the level of the output voltage signal and the reference voltage, into the source current and the sink current, when the level of the load voltage signal is between the high threshold voltage and the low threshold voltage.

18. The op-amp of claim 17, wherein the source current and the sink current of the OTA are in the same magnitude which is equivalent to the product of a transconductance value of the OTA and the magnitude of the differential input voltage.

19. The op-amp of claim 16, wherein the first current and the second current change a differential signal in the OTA when the level of the load voltage signal is higher than the high threshold voltage or lower than the low threshold voltage.

20. The op-amp of claim 16, wherein the first current and the second current change the source current and the sink current of the OTA when the level of the load voltage signal is higher than the high threshold voltage or lower than the low threshold voltage.

21. The op-amp of claim 16, wherein the receiving unit comprises a first differential input pair for receiving the load voltage signal and the high threshold voltage and a second differential input pair for receiving the load voltage signal and the low threshold voltage.

22. The op-amp of claim 21, wherein the first differential input pair is coupled to a first current source and the second differential input pair is coupled to a second current source, and the first current source and the second current source supply substantially the same magnitude of current.

23. The op-amp of claim 16, wherein the current supply unit does not supply the first current and the current draw unit does not draw the second current when the level of the load voltage signal is between the high threshold voltage and the low threshold voltage.

24. The op-amp of claim 16, wherein the current supply unit comprises at least one of a first set of current supply transistors and a second set of current supply transistors, the first set of current supply transistors supplies the first current when the level of the load voltage signal is higher than the high threshold voltage, and the second set of current supply transistors supplies the first current when the level of the load voltage signal is lower than the low threshold voltage.

25. The op-amp of claim 16, wherein the current draw unit comprises at least one of a first set of current draw transistors and a second set of current draw transistors, the first set of current draw transistors sinks the second current when the level of the load voltage signal is higher than the high threshold voltage, and the second set of current draw transistors sinks the second current when the level of the load voltage signal is lower than the low threshold voltage.

* * * * *